United States Patent [19]

Mueller

[11] Patent Number: 4,842,705
[45] Date of Patent: Jun. 27, 1989

[54] METHOD FOR MANUFACTURING TRANSPARENT CONDUCTIVE INDIUM-TIN OXIDE LAYERS

[75] Inventor: Werner Mueller, Unterhaching, Fed. Rep. of Germany

[73] Assignee: Siemens Aktiengesellschaft, Berlin and Munich, Fed. Rep. of Germany

[21] Appl. No.: 174,183

[22] Filed: Mar. 28, 1988

[30] Foreign Application Priority Data

Jun. 4, 1987 [DE] Fed. Rep. of Germany ....... 3718762

[51] Int. Cl.$^4$ .......................... C23C 14/34; B05D 3/06
[52] U.S. Cl. ........................... 204/192.29; 204/192.15; 427/38
[58] Field of Search ...................... 204/192.15, 192.26, 204/192.27, 192.28, 192.29, 192.30; 427/255.1, 372.2, 38, 39, 40; 156/653

[56] References Cited

U.S. PATENT DOCUMENTS

| | | | |
|---|---|---|---|
| 2,932,590 | 4/1960 | Barrett et al. | 117/201 |
| 3,655,545 | 4/1972 | Gillery et al. | 204/192.15 X |
| 4,124,474 | 11/1978 | Bomchil et al. | 204/192.15 X |
| 4,201,649 | 5/1980 | Gillery | 204/192.15 X |
| 4,345,000 | 8/1982 | Kawazoe et al. | 428/212 |
| 4,361,114 | 11/1982 | Gurev | 118/723 |
| 4,412,900 | 11/1983 | Tanaka et al. | 204/192.15 X |
| 4,605,565 | 8/1986 | Nath | 427/39 |

FOREIGN PATENT DOCUMENTS

| | | |
|---|---|---|
| 0161088 | 11/1985 | European Pat. Off. |
| 0217095 | 4/1987 | European Pat. Off. |
| 89766 | 5/1972 | German Democratic Rep. |

OTHER PUBLICATIONS

Hamberg et al., "Evaporated Sn–Doped $In_2O_3$ Films: Basic Optical Properties and Applications to Energy-Efficient Windows", J. Applied Physics, vol. 11, Dec. 1, 1986, pp. R123–R129.

Raviendrad et al., "$In_2O_3$ and $In_2O_3$:Sn(ITO) Films by Post–Oxidation of Metal Films", Phys. Stat. Sol. (a) 88, 1985, pp. K83–K86.

Patent Abstracts of Japan, Unexamined Applications, C Field, vol. 10, No. 136, May 20, 1986, 60-258460 (Sumitomo Kagaku Kogyo K.K.).

Patent Abstracts of Japan, Unexamined Applications, C Section, vol. 2, No. 136, Nov. 11, 1978, No. 53-102881 (Teijin K.K.).

Primary Examiner—Nam X. Nguyen
Attorney, Agent, or Firm—Hill, Van Santen, Steadman & Simpson

[57] ABSTRACT

A method for applying a transparent, conductive indium-tin oxide coating on a substrate of amorphous, hydrogen-containing silicon wherein an unheated substrate of amorphous hydrogen-containing silicon is treated with sources of indium and tin in a first stage while maintaining a low partial pressure of oxygen until a partial coating is built-up, then reducing the oxygen partial pressure in the coating zone in a second stage and continuing the coating until an additional coating thickness is built-up, followed by heating the coated substrate in an oxygen-containing atmosphere at a temperature less than 250° C.

9 Claims, 1 Drawing Sheet

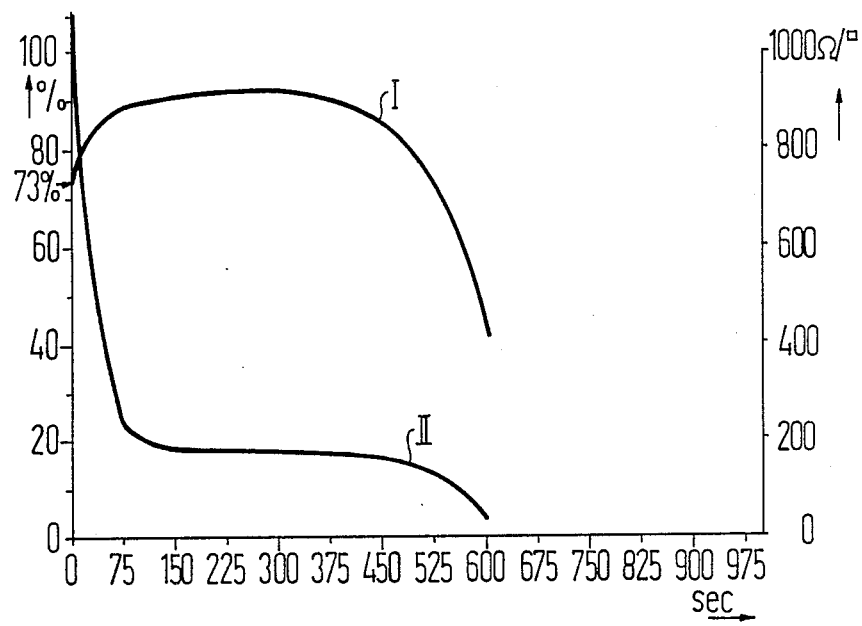

METHOD FOR MANUFACTURING TRANSPARENT CONDUCTIVE INDIUM-TIN OXIDE LAYERS

BACKGROUND OF THE INVENTION

1. Field of the Invention

This invention is in the field of manufacturing transparent, conductive indium-tin oxide layers used as electrodes for image sensor arrays by means of low pressure deposition on to an amorphous, hydrogen-containing silicon layer and subsequent heat treatment in an oxygen atmosphere.

2. Decription of the Prior Art

It is known that a cover electrode for image sensor arrays must exhibit a high transparency on the order of at least 85% for visible light and must simultaneously exhibit a low electrical sheet resistance of less than 300 ohms/square. Such specifications can only be met by indium-tin oxide (ITO) layers that have either been deposited at temperatures above 200° C. or have been heat treated at temperatures above 440° C. (see the report by Hamberg, et al., J. Appl. Phys. 60 (11) 1986, R 123 thru R 129).

For heating of the indium-tin oxide layer in the manufacture of image transducers, the following must be taken into consideration during the layer deposition or during the subsequent heat treatment:

1. In order to be able to structure the ITO layer photolithographically after deposition, the deposited material must not be exposed to a temperature higher than about 150° C. A higher temperature treatment would reduce the chemical solubility of the ITO such that a residue-free etching of the structure is no longer possible. In the alternative method for structuring, what is referred to as a lift-off technique, the substrate must be covered with a structured photoresist during the coating and can no longer be further worked after exceeding a temperature of about 100° C., i.e., it can no longer be lifted off by organic solvents.

2. Above 300° C., the photoconductive, amorphous, hydrogen-containing silicon underneath the ITO layer loses its hydrogen content which is critical for its semiconducting properties. The heat treatment at 440° C. that could lead to meeting the required specifications in the case of cold-deposited and completely structured ITO layers can therefore not be applied (see the report by Raviendrad, et al., Physica Status Solidi (a) 88 (1985) K83 through K86, and the previously cited report by Hamberg, et al.).

In addition to the noted physical restrictions, a heating and subsequent cooling of substrates in the course of manufacturing the same represents a considerable complication in view of the costs and the reduction in throughput times.

When the standard ITO manufacturing methods are modified to meet the restrictions, the specifications of the ITO are rendered noticeably poorer. The performance capability of the image sensors is thereby noticeably decreased.

A method which is likewise concerned with this problem is set forth, for example, in European Patent Application No. 0 217 095. In order to improve the values of resistance (300 ohms per square) with unaltered transparency (90%) the heat treating in this method is performed in two steps at a maximum of 200° C., the first heat treating being carried out in an oxygen atmosphere for achieving the transparency and secondly in a plasma-activated forming gas atmosphere for determining the sheet resistivity.

SUMMARY OF THE INVENTION

The present invention resolves the problems of the prior art in a different way and provides a method in which an unheated substrate is used for the coating, the partial oxygen pressure in the treating vessel is temporarily reduced during the coating, the electrode structure being processed are etched after the coating and the heat treatment is carried out in an oxygen atmosphere or in air at tempeatures below 250° C.

In a preferred embodiment of the present invention, the partial oxygen pressure is in the range from $10^{-4}$ to $10^{-2}$ mbar at the beginning of the coating process and is lowered to less than $1 \times 10^{-5}$ mbar in a second stage after about one-third of the desired layer thickness has been deposited in a first stage. The reduction in oxygen pressure can be effected by shutting off the oxygen feed. After another third of the desired layer thickness has been deposited, the original oxygen partial pressure ia again restored by resuming the feed of oxygen.

Typically, the reduced partial oxygen pressure in the second stage can be maintained for a period of from 75 to 450 seconds. When the indium-tin oxide layer is applied by electron beam evaporation, the deposition may occur at a rate of about 0.1 nm/sec in the first stage, with the second stage commencing after the coating thickness reaches about 30 nm.

The method of the present invention makes it possible to manufacture ITO layers that exhibit an electrical sheet resistance of 200 ohms per square (corresponding to a specific resistance of $20 \times 10^{-4}$ ohm cm) and a transparency of 90% for visible light.

BRIEF DESCRIPTION OF THE DRAWINGS

Further details of the invention will be set forth below with reference to a particular embodiment. In the diagram constituting the drawing, a single figure shows the dependency of the transparency in percent and the dependency of the sheet resistivity in ohms per square on the down time in seconds, i.e., on the time the flow of oxygen is interrupted. Curve I indicates the transparency values and curve II indicates the film resistivity values. As may be seen from these curves, the optimum values for transparency and sheet resistivity are obtained when the shut-off time for the oxygen is in the range from 150 to 345 seconds.

The following specific example illustrates the method of the present invention very specifically.

A reactive evaporation process was carried out wherein an oxidic initial material ($In_2O_3$ having 16 weight percent $SnO_2$) was vapor-deposited on to an unheated substrate of an amorphous, hydrogen-containing silicon layer with an electron beam gun. At the beginning of the vapor deposition, the partial oxygen pressure in the chamber was set to $8 \times 10^{-4}$ mbar. A deposition rate of 0.1 nm/sec was maintained by controlling the power of the electron beam gun. After 30 nm had been deposited on the substrate, the oxygen feed was shut-off while continuing the vapor deposition, and the oxygen pressure dropped to below $1 \times 10^{-5}$ mbar. After the oxygen feed had been disconnected for 300 seconds, the oxygen pressure was again boosted to the original value of $8 \times 10^{-4}$ mbar and the vapor deposition was continued until a layer thickness of about 100 nm was reached. The coated substrates were taken from the deposition vessel and heat treated at 200° C. for an hour in a furnace while flowing oxygen through the vessel.

Microscopic investigations of polished sections of the layers of ITO manufactured according to this invention exhibit a noticeably denser structure than layers which have been manufactured without an interruption of the oxygen feed.

The chemical etchability of the layers for photolithographic structuring after vapor deposition and before heat treating was extremely good. No etching residues were observed.

ITO layers manufactured with a sputtering method exhibit the same advantageous effects. The same is true of ITO layers which were manufactured by using metallic initial materials instead of the oxides in the described process.

It will be evident that various modifications can be made to the described embodiments without departing from the scope of the present invention.

I claim as my invention:

1. A method for applying a transparent, conductive indium-tin oxide coating on a substate of amorphous, hydrogen-containing silicon which method comprises the steps of:

providing an unheated substrate of amorphous, hydrogen-containing silicon in an enclosed coating zone;

applying sources of both indium and tin in a first stage onto said substrate while maintaining the substrate unheated and maintaining an oxygen partial pressure at a low level in said zone until a partial coating is built-up on said substrate;

temporarily reducing the oxygen partial pressure in said coating zone in a second stage and maintaining the substrate unheated and continuing the coating until an additinal coating thickness is built-up on said substrate;

continuing coating in a third stage with the oxygen partial pressure the same as during the first stage to complete the coating to a final thickness; and thereafter heating the coated substrate in an oxygen containing atmosphere at a temperature less than 250° C.

2. A method according to claim 1 which includes the step of etching said substrate after coating and before said heating.

3. A method according to claim 1 wherein said coating is applied by cathode sputtering.

4. A method according to claim 1 wherein said coating is applied by vapor deposition.

5. A method according to claim 1 in which the oxygen partial pressure in said first stage is in the range of from $10^{-4}$ to $10^{-2}$ mbar.

6. A method according to claim 1 wherein the heating takes place for about one hour at about 200° C.

7. A method for applying a transparent, conductive indium-tin oxide coating of a desired thickness on a substrate of amorphous, hydrogen-containing silicon, said method comprising the steps of:

providing an unheated substrate of amorphous, hydrogen-containing silicon in an enclosed coating zone;

applying sources of both indium and tin in a first stage onto said substrate while introducing and maintaining an oxygen partial pressure at a low level of about $8 \times 10^{-4}$ mbar in said zone until a partial coating is built-up on said substrate;

terminating the introduction of oxygen when the coating thickness is about one-third of the desired thickness to reduce the oxygen partial pressure below $1 \times 10^{-5}$ mbar in said coating zone in a second stage and continuing the coating until an additional coating thickness of about one-third of the desired coating is built-up on said substrate;

introducing additional oxygen until the partial oxygen pressure is approximately that used in said first stage and continuing the coating until the desired coating thickness is achieved; and thereafter heating the coated substrate in an oxygen containing atmosphere at a temperature less than 250° C.

8. A method according to claim 7 wherein said oxygen partial pressure in said second stage is maintained for a period of from 75 to 450 seconds.

9. A method according to claim 7 wherein said desired coating thickness is about 100 nm, an indium-tin oxide layer is applied by electron beam evaporation at a rate of about 0.1 nm/sec in said first stage, and said second stage is commenced after the coating thickness reaches about 30 nm, and said oxygen partial pressure in said second stage is maintained for a period of about 300 seconds.

* * * * *